(12) United States Patent
Liu et al.

(10) Patent No.: US 12,426,479 B2
(45) Date of Patent: Sep. 23, 2025

(54) DISPLAY PANEL AND DISPLAY DEVICE

(71) Applicant: Wuhan China Star Optoelectronics Semiconductor Display Technology Co., Ltd., Wuhan (CN)

(72) Inventors: Hanchen Liu, Wuhan (CN); Wenxu Xianyu, Wuhan (CN); Chunpeng Zhang, Wuhan (CN)

(73) Assignee: Wuhan China Star Optoelectronics Semiconductor Display Technology Co., Ltd, Wuhan (CN)

( * ) Notice: Subject to any disclaimer, the term of this patent is extended or adjusted under 35 U.S.C. 154(b) by 0 days.

(21) Appl. No.: 17/785,076

(22) PCT Filed: May 19, 2022

(86) PCT No.: PCT/CN2022/093851
§ 371 (c)(1),
(2) Date: Jun. 14, 2022

(87) PCT Pub. No.: WO2023/193326
PCT Pub. Date: Oct. 12, 2023

(65) Prior Publication Data
US 2024/0196700 A1   Jun. 13, 2024

(30) Foreign Application Priority Data
Apr. 6, 2022   (CN) .......................... 202210355188.6

(51) Int. Cl.
*H10K 59/80*   (2023.01)
*H10K 59/131*   (2023.01)
*H10K 102/00*   (2023.01)

(52) U.S. Cl.
CPC ......... *H10K 59/873* (2023.02); *H10K 59/131* (2023.02); *H10K 2102/311* (2023.02)

(58) Field of Classification Search
CPC ............ Y02E 10/549; H10K 2102/311; H10K 50/844; H10K 50/80; H10K 77/111; H10K 59/873; H10K 59/00; H10K 59/131
See application file for complete search history.

(56) References Cited

U.S. PATENT DOCUMENTS

| | | | |
|---|---|---|---|
| 10,121,977 B2 * | 11/2018 | Lee | H10K 59/1213 |
| 10,211,277 B2 * | 2/2019 | Lee | H10K 77/111 |

(Continued)

FOREIGN PATENT DOCUMENTS

| | | |
|---|---|---|
| CN | 107958636 A | 4/2018 |
| CN | 109509769 A | 3/2019 |

(Continued)

OTHER PUBLICATIONS

International Search Report in International application No. PCT/CN2022/093851, mailed on Dec. 15, 2022.

(Continued)

*Primary Examiner* — Vongsavanh Sengdara
(74) *Attorney, Agent, or Firm* — Nathan & Associates; Menachem Nathan

(57) ABSTRACT

A display panel and a display device are provided. The display panel includes a substrate including a first flexible base, an inorganic insulating layer, a driving circuit layer, a light emitting layer including a common layer, and an encapsulation layer including at least one inorganic layer. A first undercut structure is defined on a peripheral area of the display panel, and the common layer includes a first portion and a second portion disconnected by the first undercut structure. At least one inorganic layer covers the first portion and does not exceed an end of the common layer away from a light emitting area.

18 Claims, 5 Drawing Sheets

(56) References Cited

U.S. PATENT DOCUMENTS

| | | | |
|---|---|---|---|
| 2016/0174304 A1* | 6/2016 | Kim | H10K 59/8792 |
| 2016/0204373 A1 | 7/2016 | Park | |
| 2016/0351155 A1 | 12/2016 | Park et al. | |
| 2017/0170206 A1* | 6/2017 | Lee | H10D 86/441 |
| 2018/0047938 A1* | 2/2018 | Kishimoto | H10K 77/111 |
| 2018/0342707 A1* | 11/2018 | Lee | H10K 50/844 |
| 2019/0012031 A1* | 1/2019 | Kim | H10K 50/805 |
| 2019/0164995 A1* | 5/2019 | Lee | H10D 86/411 |
| 2019/0324567 A1* | 10/2019 | Hong | G06F 3/0446 |
| 2021/0091319 A1* | 3/2021 | Yang | H10K 59/131 |
| 2021/0175472 A1* | 6/2021 | Kim | H10K 50/8426 |
| 2021/0202656 A1* | 7/2021 | Ka | H01L 25/167 |

FOREIGN PATENT DOCUMENTS

| | | |
|---|---|---|
| CN | 109801956 A | 5/2019 |
| CN | 208848933 U | 5/2019 |
| CN | 110416435 A | 11/2019 |
| CN | 110429193 A | 11/2019 |
| CN | 110504386 A | 11/2019 |
| CN | 110634928 A | 12/2019 |
| CN | 110993660 A | 4/2020 |
| CN | 111403621 A | 7/2020 |
| CN | 112331677 A | 2/2021 |
| CN | 113851520 A | 12/2021 |
| CN | 215644561 U | 1/2022 |

OTHER PUBLICATIONS

Written Opinion of the International Search Authority in International application No. PCT/CN2022/093851, mailed on Dec. 15, 2022.

Chinese Office Action issued in corresponding Chinese Patent Application No. 202210355188.6 dated Mar. 24, 2025, pp. 1-8.

* cited by examiner

DISPLAY PANEL AND DISPLAY DEVICE

FIELD OF INVENTION

The present application relates to a field of display technology, and particularly relates to a display panel and a display device.

BACKGROUND OF INVENTION

After an explosive growth of full-screen concept products in 2018, they have occupied more than half of smartphone market, wherein a market share of organic light-emitting diodes (OLEDs) full-screen products is as high as about 80%. However, in current OLED full-screen concept products, due to a limitation of packaging technology, a development of narrow frame technology has not yet made further breakthroughs. Therefore, it is urgent to provide an OLED display product capable of further narrowing the frame.

Technical Problem

The present application provides a display panel and a display device capable of further narrowing the frame.

SUMMARY OF INVENTION

The present application provides a display panel defined with a light-emitting area and a peripheral area positioned on at least one side of the light-emitting area, the display panel includes: a substrate including a first flexible base; an inorganic insulating layer disposed on a side of the substrate; a driving circuit layer disposed on a side of the inorganic insulating layer away from the substrate; a light-emitting layer disposed on a side of the driving circuit layer away from the inorganic insulating layer, wherein the light-emitting layer includes a common layer; and an encapsulation layer disposed on a side of the light-emitting layer away from the driving circuit layer, wherein the encapsulation layer includes at least one inorganic layer; wherein the peripheral area is defined with a groove penetrating the inorganic insulating layer and the first flexible base, wherein a sidewall of the groove is defined with a first undercut structure, wherein the common layer includes a first portion and a second portion, the first portion is positioned in the light-emitting area and the peripheral area, the second portion is at least partially positioned in the groove, and the first portion and the second portion are disconnected by the first undercut structure, and wherein the at least one inorganic layer covers an end of the first portion away from the light-emitting area, and an end of the at least one inorganic layer away from the light-emitting area does not exceed an end of the common layer away from the light-emitting area.

Optionally, in some embodiments, the display panel is further defined with an opening exposing a portion of the substrate, wherein the portion of the substrate exposed by the opening is bent to a back of the display panel to form a bending portion, and wherein the groove communicates with the opening, and the groove is defined on the sidewall of the opening close to the light-emitting area.

Optionally, in some embodiments, the substrate further includes: a second flexible base disposed on a side of the first flexible base away from the driving circuit layer; and a barrier layer and a line switching layer arranged in a same layer between the first flexible base and the second flexible base, wherein the line switching layer is arranged corresponding to the opening; wherein the driving circuit layer includes a first signal line and a first fan-out line, the first signal line is positioned in the light-emitting area, the first fan-out line is positioned in the back of the display panel, and the first signal line and the first fan-out line are respectively connected to the line switching layer through via-holes.

Optionally, in some embodiments, the driving circuit layer further includes a second signal line and a second fan-out line arranged in different layers, the second signal line is positioned in the light-emitting area, the second fan-out line is positioned in the back of the display panel, the line switching layer is positioned between the second signal line and the second fan-out line, and the second signal line and the second fan-out line are respectively connected to the line switching layer through via holes.

Optionally, in some embodiments, the first signal line and the first fan-out line are arranged in a same layer, and the second signal line and the second fan-out line are arranged in a same layer, wherein the line switching layer includes a first switching line and a second switching line insulated from each other and spaced apart, the first signal line is connected to the first fan-out line through the first switching line, and the second signal line is connected to the second fan-out line through the second switching line.

Optionally, in some embodiments, the driving circuit layer includes a gate electrode and a source electrode arranged in different layers, the first signal line is arranged in a same layer as the gate electrode, and the second signal line is arranged in a same layer as the source electrode.

Optionally, in some embodiments, a surface of the first flexible base of the bending portion away from the line switching layer includes a gas medium layer or a vacuum layer.

Optionally, in some embodiments, the common layer includes at least one of an electron injection layer, an electron transport layer, or an electrode layer.

Optionally, in some embodiments, the peripheral area encircles the light-emitting area, the first undercut structure encircles the light-emitting area to form a closed loop, and the first undercut structure is positioned on the sidewall of the groove close to the light-emitting area.

Optionally, in some embodiments, the sidewall of the groove away from the light-emitting area is further defined with a second undercut structure, and wherein the common layer further includes a third portion positioned on a side of the second portion away from the first portion, and the second portion and the third portion are disconnected by the second undercut structure.

Optionally, in some embodiments, the display panel further includes a dielectric layer disposed between the inorganic insulating layer and the light-emitting layer, wherein the groove further penetrates the dielectric layer, and the at least one inorganic layer covers the groove and is in direct contact with the inorganic insulating layer and the dielectric layer on the sidewall of the groove to form a closed inorganic packaging structure.

The present application further provides a display device, which includes a display panel and a driving assembly connected to the display panel, wherein the display panel is the aforesaid display panel.

Optionally, in some embodiments, the display panel is further defined with an opening exposing a portion of the substrate, the portion of the substrate exposed by the opening is bent to a back of the display panel to form a bending portion, and the groove communicates with the opening, and the groove is defined on a sidewall of the opening close to the light-emitting area.

Optionally, in some embodiments, the substrate further includes: a second flexible base disposed on a side of the first flexible base away from the driving circuit layer; and a barrier layer and a line switching layer arranged in a same layer between the first flexible base and the second flexible base, wherein the line switching layer is arranged corresponding to the opening; wherein the driving circuit layer includes a first signal line and a first fan-out line, the first signal line is positioned in the light-emitting area, the first fan-out line is positioned in the back of the display panel, and the first signal line and the first fan-out line are respectively connected to the line switching layer through viaholes.

Optionally, in some embodiments, the driving circuit layer further includes a second signal line and a second fan-out line arranged in different layers, the second signal line is positioned in the light-emitting area, the second fan-out line is positioned in the back of the display panel, the line switching layer is positioned between the second signal line and the second fan-out line, and the second signal line and the second fan-out line are respectively connected to the line switching layer through via holes.

Optionally, in some embodiments, the first signal line and the first fan-out line are arranged in a same layer, and the second signal line and the second fan-out line are arranged in a same layer, wherein the line switching layer includes a first switching line and a second switching line insulated from each other and spaced apart, the first signal line is connected to the first fan-out line through the first switching line, and the second signal line is connected to the second fan-out line through the second switching line.

Optionally, in some embodiments, the driving circuit layer includes a gate electrode and a source electrode arranged in different layers, the first signal line is arranged in a same layer as the gate electrode, and the second signal line is arranged in a same layer as the source electrode.

Optionally, in some embodiments, a surface of the first flexible base of the bending portion away from the line switching layer includes a gas medium layer or a vacuum layer.

Optionally, in some embodiments, the common layer includes at least one of an electron injection layer, an electron transport layer, or an electrode layer.

Optionally, in some embodiments, the peripheral area encircles the light-emitting area, the first undercut structure encircles the light-emitting area to form a closed loop, and the first undercut structure is positioned on the sidewall of the groove close to the light-emitting area.

Advantages

In current display panels and display devices, failure occurs because a common layer in a light-emitting layer is susceptible to infiltration of water and oxygen. In order to protect the common layer, an inorganic layer in an encapsulation layer needs to cover an end of the common layer away from the light-emitting area, resulting in a larger width of the encapsulation layer. In the display panel and the display device of the present application, the common layer is disconnected by a first undercut structure, a propagation path of water and oxygen between a first portion and a second portion of the common layer is cut off, which can act as a water and oxygen barrier and prevent crack propagation. The inorganic layer in the encapsulation layer only needs to cover an end of the first portion positioned in the light-emitting area, and does not need to cover the end of the common layer away from the light-emitting area. In the present application, the end of the inorganic layer away from the light-emitting area is configured not to exceed the end of the common layer away from the light-emitting area. Compared with a situation in the prior art that the inorganic layer needs to cover the end of the common layer away from the light emitting area, the width of the encapsulation layer proposed by the present application is significantly reduced, thereby achieving the effect of a narrow frame.

DETAILED DESCRIPTION OF PREFERRED EMBODIMENTS

Figure 1:
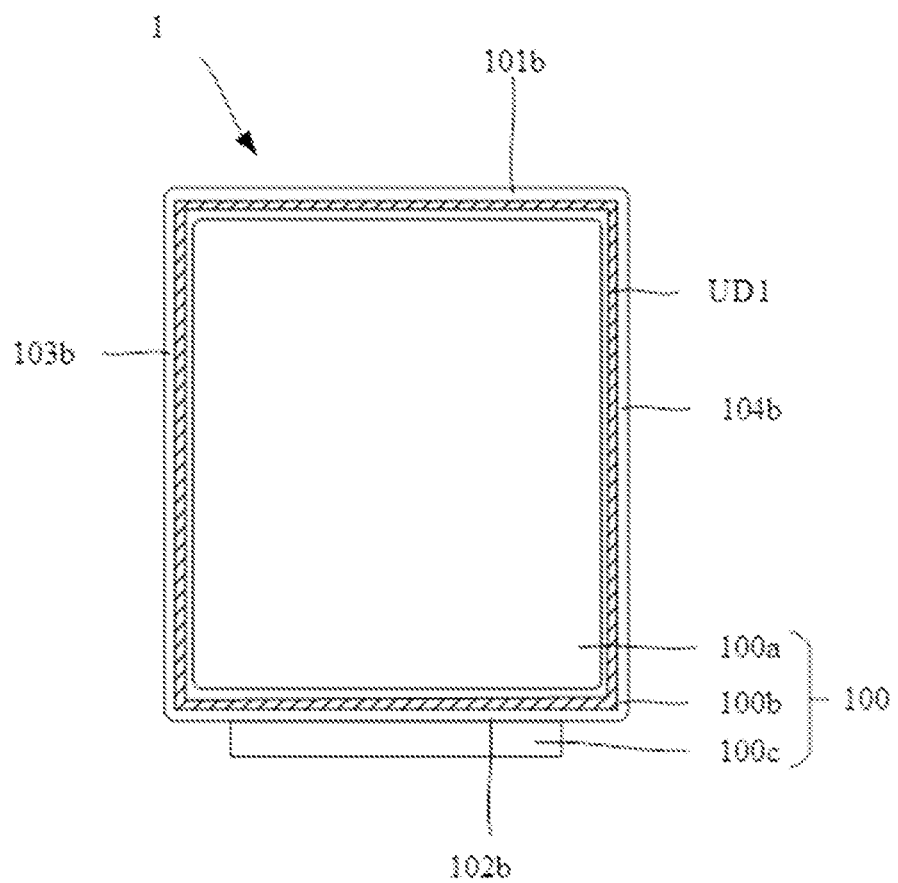
FIG. 1 is a schematic plan view of a display device of the present application.

The technical solutions in the present application will be clearly described with reference to the drawings in the embodiments of the present application. Obviously, the embodiments are only part of the embodiments of the present application, but not all the embodiments. Based on the embodiments in the present application, all other embodiments obtained by one skilled in the art without creative work fall within the protection scope of the present application.

In this application, unless otherwise expressly stated and defined, a first feature "on" or "under" a second feature may include the direct connection of the first feature and the second feature. It may also be included that the first feature and the second feature are not directly connected but are in contact through another feature therebetween. Also, the first feature being "above", "over", and "on" a second feature includes that the first feature is directly above and diagonally above the second feature, or simply means that the level of the first feature is higher than the level of the second feature. The first feature is "below", "under", and "underneath" the second feature includes that the first feature is directly below and diagonally below the second feature, or simply means that the level of the first feature is lower than that of the second feature. In addition, the terms "first" and "second" are only used for descriptive purposes, and should not be construed as indicating or implying relative importance or implying the number of indicated technical features. Thus, features defined as "first", "second" may expressly or implicitly include one or more features.

Aspects and features of various embodiments of the present disclosure may be combined with each other in part or in whole. Each embodiment may be implemented independently of each other, or may be partially or fully associated with each other and implemented together.

The present application provides a display panel and a display device including the display panel. The display panel has a light-emitting area and a peripheral area positioned on at least one side of the light-emitting area. The display panel includes a substrate, an inorganic insulating layer, a driving circuit layer, a light-emitting layer, and an encapsulation layer. The substrate includes a first flexible base. The inorganic insulating layer is disposed on a side of the substrate. The driving circuit layer is disposed on a side of the inorganic insulating layer away from the substrate. The light-emitting layer is disposed on a side of the driving circuit layer away from the inorganic insulating layer, and the light-emitting layer includes a common layer. The encapsulation layer is disposed on a side of the light-emitting layer away from the driving circuit layer, and the encapsulation layer includes at least one inorganic layer. Wherein, a groove is defined in the peripheral area, and the groove penetrates the inorganic insulating layer and the first flexible base, and a first undercut structure is defined on the sidewall of the groove. The common layer includes a first portion and a second portion, the first portion is positioned in the light-emitting area, the second portion is at least partially positioned in the groove, and the first portion and the second portion are disconnected by the first undercut structure. At least one inorganic layer covers an end of the first portion away from the light-emitting area, and the end of the at least one inorganic layer away from the light-emitting area does not exceed an end of the common layer far away from the light-emitting area.

In the current display panels and display devices, failure occurs because a common layer in a light-emitting layer is easily invaded by water and oxygen. In order to protect the common layer, an inorganic layer in an encapsulation layer needs to cover an end of the common layer away from the light-emitting area, resulting in a larger encapsulation width of the encapsulation layer. In the display panel and the display device of the present application, the common layer is disconnected by a first undercut structure, a propagation path of water and oxygen between a first portion and a second portion of the common layer is cut off, which can act as a water and oxygen barrier and prevent crack propagation. Therefore, the inorganic layer in the encapsulation layer only needs to cover an end of the first portion positioned in the light-emitting area, and does not need to cover the end of the common layer away from the light-emitting area. In the present invention, the end of the inorganic layer away from the light-emitting area does not exceed the end of the common layer away from the light-emitting area. Compared with a situation in the prior art where the inorganic layer needs to cover the end of the common layer away from the light-emitting area, the width of the encapsulation layer proposed by the present invention is significantly reduced, thereby achieving the effect of a narrow frame.

Hereinafter, the display panel and the display device of the present application will be described in detail with reference to specific embodiments.

Figure 2:
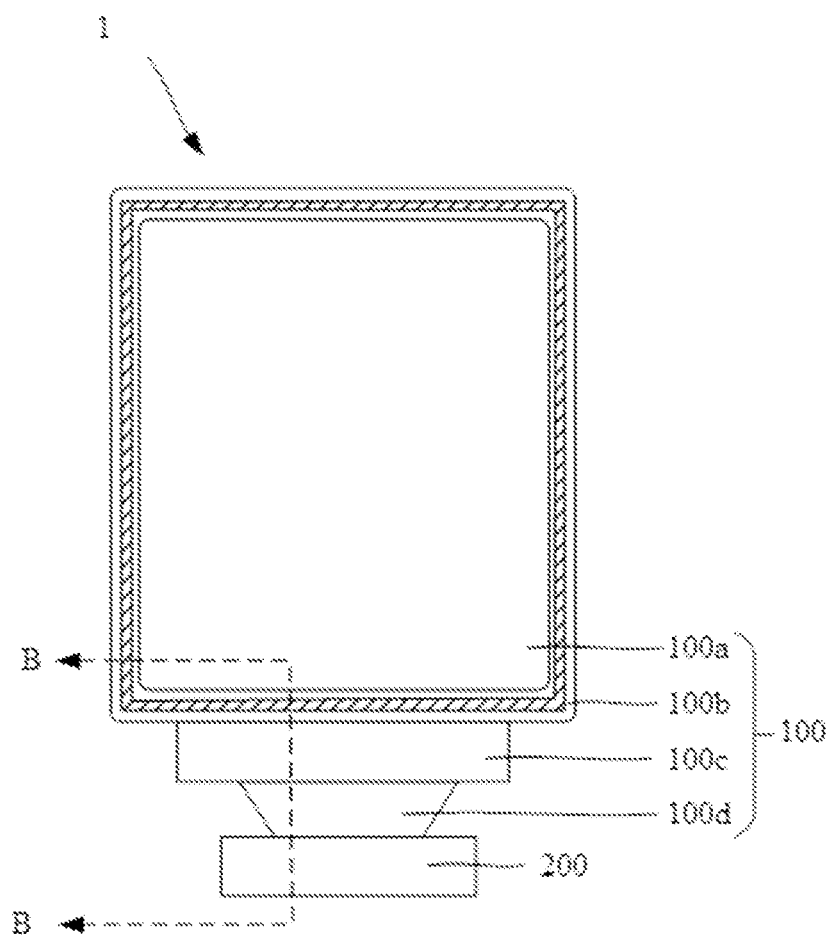
FIG. 2 is a schematic structural diagram of the display device of FIG. 1 in an unfolded state.

Please refer to FIG. 1 and FIG. 2, the display device 1 includes a display panel 100 and a driving assembly 200 connected to the display panel 100. The display panel 100 is used for displaying images, and the driving assembly 200 is used for driving the display panel 100 to display.

The display panel 100 includes a light-emitting area 100*a* and a peripheral area 100*b* positioned on at least one side of the light-emitting area 100*a*. As shown in FIG. 1, the display panel 100 may be rectangular, and the peripheral area 100*b* may be positioned on at least one of an upper side, a lower side, a left side, or a right side of the light-emitting area 100*a*. That is, the peripheral area 100*b* may include at least one of an upper frame area 101*b*, a lower frame area 102*b*, a left frame area 103*b*, or a right frame area 104*b*. Optionally, in this embodiment, the peripheral area 100*b* encircles the light-emitting area 100*a*. Further, the display panel 100 further includes a bending area 100*c* and a fan-out area 100*d*. The bending area 100*c* may also be referred to as a pad bending area (Pad Bending). The bending area 100*c* is positioned on a side of the lower frame area 102*b* in the peripheral area 100*b* away from the light-emitting area 100*a*. The fan-out area 100*d* is positioned on a side of the bending area 100*c* away from the lower frame area 102*b*. In addition, the light-emitting area 100*a*, the peripheral area 100*b*, the bending area 100*c*, and the fan-out area 100*d* are sequentially connected.

The display panel 100 includes a light-emitting area 100*a* and a peripheral area 100*b* positioned on at least one side of the light-emitting area 100*a*. As shown in FIG. 1, the display panel 100 may be rectangular, and the peripheral area 100*b* may be positioned on at least one side of the upper side, the lower side, the left side, or the right side of the light-emitting area 100*a*. That is, the peripheral area 100*b* may include at least one of an upper frame area 101*b*, a lower frame area 102*b*, a left frame area 103*b*, or a right frame area 104*b*. Optionally, in this embodiment, the peripheral area 100*b* surrounds the light-emitting area 100*a*. Further, the display panel 100 further includes a bending area 100*c* and a fan-out area 100*d*. The bending area 100*c* may also be referred to as a pad bending area (Pad Bending). The bending area 100*c* is positioned on a side of the lower frame area 102*b* in the peripheral area 100*b* away from the light-emitting area 100*a*. The fan-out area 100*d* is positioned on a side of the bending area 100*c* away from the lower frame area 102*b*. In addition, the light-emitting area 100*a*, the peripheral area 100*b*, the bending area 100*c*, and the fan-out area 100*d* are sequentially connected.

The driving assembly 200 is connected to a side of the fan-out area 100*d* of the display panel 100 away from the light-emitting area 100*a*. The driving assembly 200 may include a chip on film (COF) and/or a flexible printed circuit (FPC).

Figure 3:
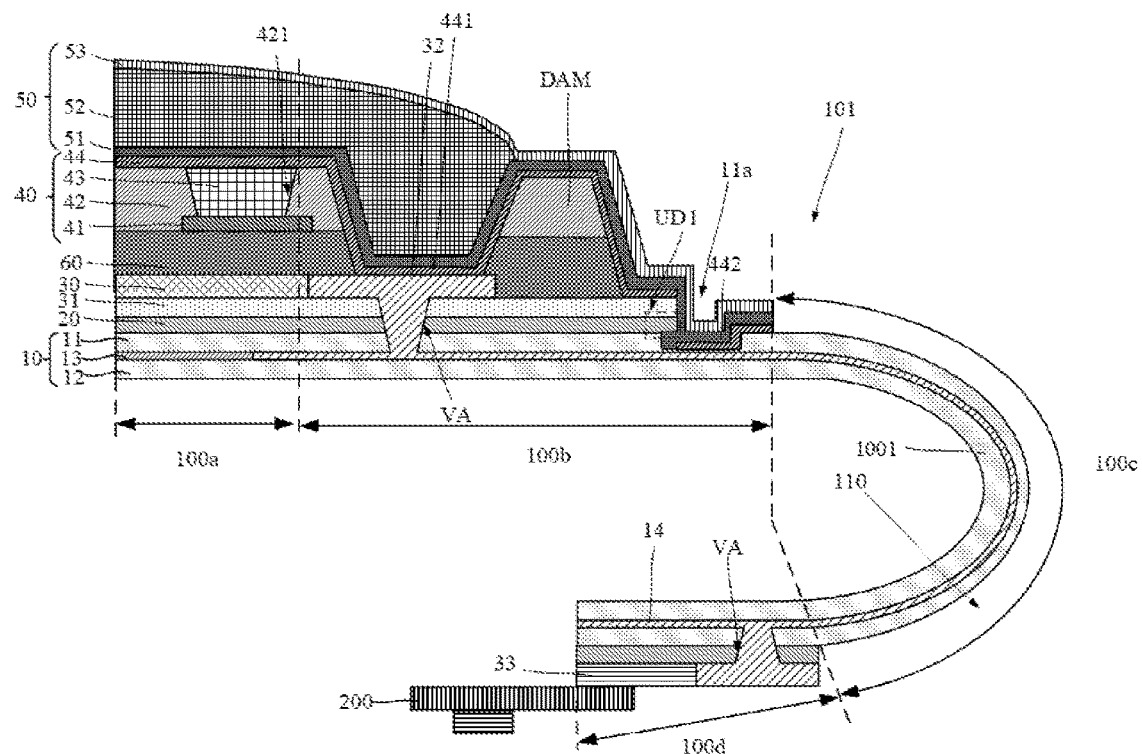
FIG. 3 is a cross-sectional view of a structure of the display device of FIG. 1 taken along a line A-A.
Figure 4:
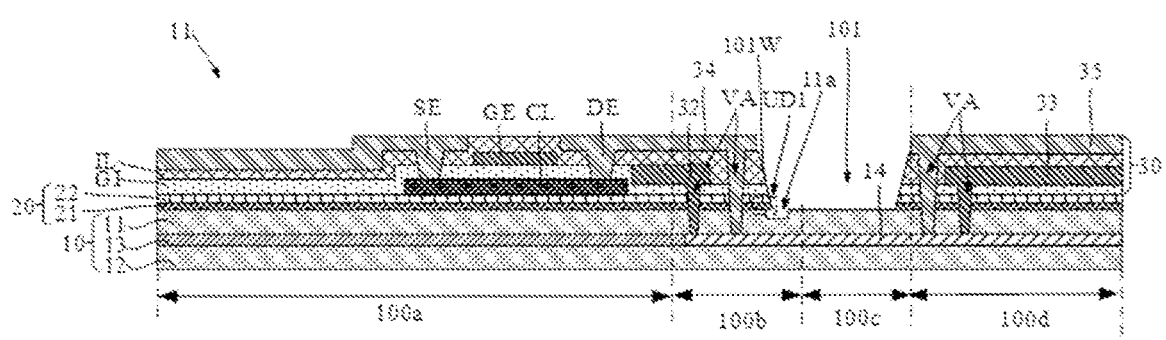
FIG. 4 is a partial cross-sectional view of a structure of the display device of FIG. 2 taken along a line B-B.

Please refer to FIG. 3 and FIG. 4. For the convenience of description, the light-emitting layer 40 and the encapsulation layer 50 are omitted in FIG. 4. The display panel 100 includes a substrate 10, an inorganic insulating layer 20, a driving circuit layer 30, a light-emitting layer 40, and an encapsulation layer 50. The inorganic insulating layer 20 is disposed on a side of the substrate 10. The driving circuit layer 30 is disposed on a side of the inorganic insulating layer 20 away from the substrate 10. The light-emitting layer 40 is disposed on a side of the driving circuit layer 30 away from the inorganic insulating layer 20. The encapsulation layer 50 is disposed on a side of the light-emitting layer 40 away from the driving circuit layer 30.

Substrate 10 is positioned in the light-emitting area 100*a*, the peripheral area 100*b*, the bending area 100*c*, and the fan-out area 100*d*. The substrate 10 includes a first flexible base 11, a second flexible base 12, a barrier layer 13 and a line switching layer 14 disposed between the first flexible base 11 and the second flexible base 12. The barrier layer 13 and the line switching layer 14 are disposed on the same layer. Barrier layer 13 is positioned in least in the light-emitting area 100*a*. The line switching layer 14 is positioned in least in the peripheral area 100*b* and the bending area 100*c*. Optionally, the line switching layer 14 may also be positioned in the light-emitting area 100*a* and the fan-out area 100*d*. Optionally, the barrier layer 13 and the line switching layer 14 may be directly connected. Specifically, part of the barrier layer 13 positioned on the first flexible base 11 can be etched away, and then the line switching layer 14 can be formed at the position where the barrier layer 13 is removed by etching.

The materials of the first flexible base 11 and the second flexible base 12 are independently selected from one of polyimide (PI), polyethylene naphthalate (PEN), polyethylene terephthalate (PET), polyarylate (PAR), polycarbonate (PC), polyetherimide (PEI), or polyethersulfone (PES). The material of the barrier layer 13 can be selected from inorganic materials such as silicon oxide ($SiO_x$), silicon nitride ($SiN_x$), silicon oxynitride (SiON), or their stacks, to prevent the diffusion of water vapor from the second flexible base 12 to the driving circuit layer 30. The line switching layer 14 may be a single-layer metal wire such as Cu (copper), Mo (molybdenum), Al (aluminum), silver (Ag), etc., or a stacked metal wire thereof. In order to facilitate bending, the material of the line switching layer 14 is a material with certain bending properties. Optionally, the line switching layer 14 is a neutral layer of the substrate 10. Specifically, the line switching layer 14 can be precisely adjusted to be the neutral layer of the substrate 10 by controlling the thicknesses of the two flexible bases. The neutral layer refers to the layer with the least stress in the film structure of the substrate 10.

An opening 101 is defined on the display panel 100. The opening 101 is positioned in the peripheral area 100b and the bending area 100c. The opening 101 penetrate through the driving circuit layer 30 and the inorganic insulating layer 20 in sequence, and exposing the substrate 10. The substrate 10 exposed by the opening 101 is bent to the back of the display panel 100 to form a bending portion 1001. The line switching layer 14 is disposed corresponding to the opening 101. Specifically, the orthographic projection of the sidewall 101W of the opening 101 on the plane where the line switching layer 14 is positioned overlaps with the line switching layer 14. However, in the longitudinal direction of the display panel 100, the length of the line switching layer 14 is far longer than the length of the opening 101. The aforesaid "substrate 10 is bent to the back of the display panel 100 to form the bending portion 1001" means that the first flexible base 11, the second flexible base 12, and the line switching layer 14 are bent to the back of the display panel 100 to form a bending portion 1001. The surface of the first flexible base 11 of the bending portion 1001 away from the line switching layer 14 is the gas medium layer 110. In other words, the opening 101 is not filled with a flexible organic material, but is filled with a gas, and the gas may be air or an inert gas, such as nitrogen and the like. In other embodiments, the surface of the first flexible base 11 of the bending portion 1001 away from the line switching layer 14 may also be a vacuum layer, that is, it is evacuated instead of being filled with gas.

A groove 11a is defined on the peripheral area 100b, the groove 11a penetrates the inorganic insulating layer 20 and the first flexible base 11, and a first undercut structure UD1 is defined on the sidewall 101W of the groove 11a. The first undercut structure UD1 is formed by etching. Since the etching speed of the etching solution or the etching gas to the first flexible base 11 is higher than the etching speed of the inorganic insulating layer 20 during the etching process, after the etching is completed, the amount of the inorganic insulating layer 20 removed by etching is less than the amount of the first flexible base 11 removed by etching. Thus, the first undercut structure UD1 is formed between the inorganic insulating layer 20 and the first flexible base 11.

In this embodiment, the peripheral area 100b surrounds the light-emitting area 100a, and the first undercut structure UD1 forms a closed loop surrounding the light-emitting area 100a. The first undercut structure UD1 is positioned on the sidewall 101W of the groove 11a close to the light-emitting area 100a. Further, in the lower frame area 102b, that is, the frame area where the bending area 100c and the fan-out area 100d are connected, the groove 11a communicates with the opening 101. Moreover, the groove 11a is formed on the sidewall 101W of the opening 101 close to the light-emitting area 100a. In other positions, such as the upper frame area 101b, the left frame area 103b, and the right frame area 104b, the openings 101 for bending are not provided, and the grooves 11a are directly defined.

The inorganic insulating layer 20 is positioned in least in the light-emitting area 100a, the peripheral area 100b, and the fan-out area 100d. The inorganic insulating layer 20 in the bending area 100c is removed to facilitate bending. The inorganic insulating layer 20 is disposed between the substrate 10 and the driving circuit layer 30 to block water and oxygen from entering the driving circuit layer 30 from the substrate 10, and/or enhance the bonding force between the substrate 10 and the driving circuit layer 30. The inorganic insulating layer 20 includes at least one layer of silicon nitride, silicon oxide, or amorphous silicon (a-Si). Optionally, in this embodiment, the inorganic insulating layer 20 includes a barrier layer 21 (also known as a 3 L layer) and a buffer layer 22. The barrier layer 21 is positioned on the side of the buffer layer 22 close to the substrate 10. The buffer layer 22 includes silicon nitride, silicon oxide, or a stack of silicon nitride and silicon oxide. The barrier layer 21 includes a stack of silicon nitride, silicon oxide, and a-Si. Optionally, in other embodiments of the present application, the inorganic insulating layer 20 may include only one of the buffer layer 22 or the barrier layer 21. Optionally, in some embodiments, the inorganic insulating layer 20 may also be a dielectric layer formed in the peripheral area 100b during the formation of the driving circuit layer 30, for example, a gate insulating layer, an interlayer insulating layer, or the like.

The driving circuit layer 30 is positioned in the light-emitting area 100a and the fan-out area 100d. The driving circuit layer 30 positioned in the light-emitting area 100a includes a driving circuit for OLED display such as 2T1C, 3T1C, 5T1C or 7T1C.

Optionally, the display panel further includes a dielectric layer 31 positioned in the peripheral area 100b. The dielectric layer 31 is an insulating material layer formed in the peripheral area 100b by processes such as vapor deposition during the formation of the driving circuit layer 30. The dielectric layer 31 includes inorganic dielectric layers such as a gate insulating layer GI and an interlayer insulating layer IL. Materials of the dielectric layer 31 include silicon oxide, silicon nitride, or stacks thereof. Since the dielectric layer 31 is positioned in the peripheral area 100b and covers the inorganic insulating layer 20 and the first flexible base 11 in the peripheral area 100b, the groove 11a penetrates the dielectric layer 31 before penetrating the inorganic insulating layer 20 and the first flexible base 11.

The driving circuit layer 30 includes a first signal line 32 and a first fan-out line 33, the first signal line 32 is positioned in the light-emitting area 100a, and the first fan-out line 33 is positioned in the fan-out area 100d and on the back of the display panel 100. The line switching layer 14 is positioned between the first signal line 32 and the first fan-out line 33, and the first signal line 32 and the first fan-out line 33 are respectively connected to the line switching layer 14 through the via-holes VA. The first signal line 32 is connected to an end of the line switching layer 14 close to the light-emitting area 100a, and the layer of the first fan-out line 33 is connected to an end of the line switching layer 14 away from the light-emitting area 100a.

The driving circuit layer 30 further includes a second signal line 34 and a second fan-out line 35, the second signal line 34 is disposed on a different layer from the first signal line 32, the second signal line 34 is positioned in the light-emitting area 100a, and the second fan-out line 35 is positioned in the fan-out area 100d and is positioned at the back of the display panel 100. The line switching layer 14 is positioned between the second signal line 34 and the second fan-out line 35, and the second signal line 34 and the second fan-out line 35 are respectively connected to the line switching layer 14 through the via-hole VA. The second signal line 34 is connected to an end of the line switching layer 14 close to the light-emitting area 100a, and the second fan-out line 35 is connected to an end of the line switching layer 14 away from the light-emitting area 100a. The first signal line 32 and the second signal line 34 may be gate lines, data lines, VDD signal lines, or VSS signal lines, or the like.

Figure 5:
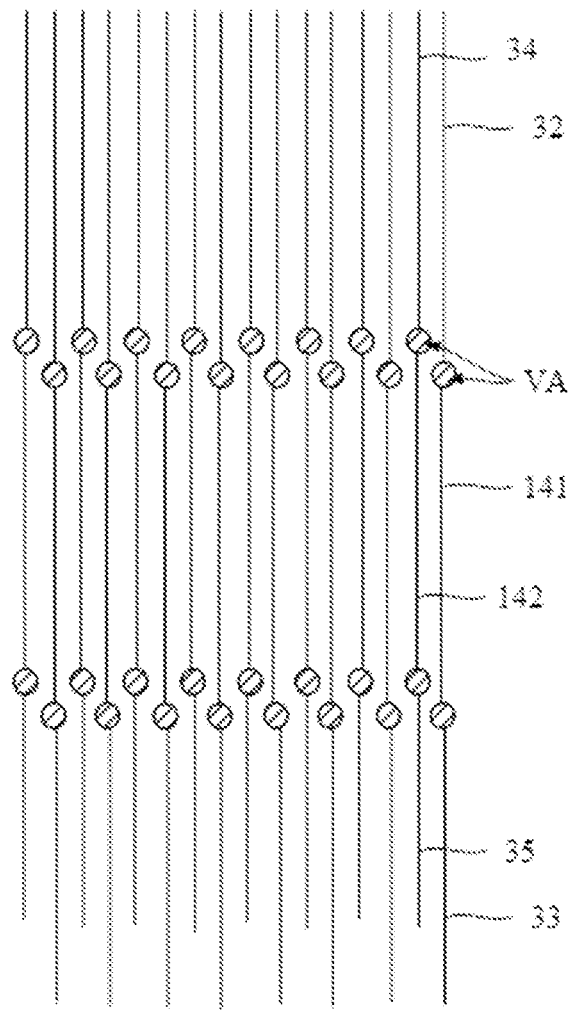
FIG. 5 is a schematic top view of a first signal line, a second signal line, a first fan-out line, and a second fan-out line of the display panel of FIG. 1.

Optionally, the first signal line 32 and the first fan-out line 33 are arranged on the same layer, and the second signal line 34 and the second fan-out line 35 are arranged on the same layer. Please refer to FIG. 5, when viewed from above, the line switching layer 14 includes a first switching line 141 and a second switching line 142. The first switching line 141 and the second switching line 142 are insulated and spaced apart. The first signal line 32 and the second signal line 34 are insulated and spaced apart. The first signal line 32 is connected to the first fan-out line 33 via the first switching line 141, and the second signal line 34 is connected to the second fan-out line 35 via the second switching line 142.

The driving circuit layer 30 includes a gate electrode GE, a source electrode SE, a drain electrode DE, and a semiconductor layer CL, and the gate electrode GE is provided in different layers from the source electrode SE and the drain electrode DE. In this embodiment, the thin film transistors in the driving circuit layer 30 are top-gate thin film transistors. The semiconductor layer CL is disposed on the substrate 10. The gate GE is disposed on the side of the semiconductor layer CL away from the substrate 10. The source electrode SE and the drain electrode DE are disposed on the side of the gate electrode GE away from the substrate 10. The first signal line 32 is positioned on the side of the second signal line 34 close to the substrate 10. Optionally, the first signal line 32 is in the same layer as the gate electrode GE, and the second signal line 34 is in the same layer as the source electrode SE and the drain electrode DE. It can be understood that in other embodiments of the present application, the first signal line 32 and the second signal line 34 can also be provided in the same layer as other metal film layers in the driving circuit layer 30, such as a light shielding layer. In other embodiments of the present application, the second fan-out line 35 may also be arranged on the same layer as the first fan-out line 33. That is, the first signal line 32 and the second signal line 34 are switched to the same layer after passing through the line switching layer.

The light-emitting layer 40 includes a first electrode layer 41, a pixel definition layer 42, a light-emitting material layer 43, and a common layer 44. A planarization layer 60 is further disposed between the driving circuit layer 30 and the light-emitting layer 40 to flatten the plane formed above the driving circuit layer 30, which is helpful for forming the light-emitting layer 40. The first electrode layer 41 is disposed on the planarization layer 60 and is connected to the driving circuit layer 30 through the connection hole defined on the planarization layer 60. Optionally, the first electrode layer 41 may be an anode. The pixel definition layer 42 covers the planarization layer 60, and a plurality of pixel definition openings 421 for exposing the first electrode layer 41 are defined on the pixel definition layer 42. The light-emitting material layer 43 is arranged in the pixel defining opening 421. The light-emitting material layer 43 may include hole functional layers such as an organic light-emitting layer, a hole injection layer, and a hole transport layer. The light-emitting material layer 43 may be formed by inkjet printing. The common layer 44 refers to a film layer formed by vapor deposition using a common mask during the manufacturing process of the light-emitting layer 40. The common layer 44 may specifically include at least one of an electron injection layer, an electron transport layer, or a second electrode layer, but is not limited thereto. Wherein, the second electrode layer is a cathode. It can be understood that in other embodiments of the present application, the OLED device is an inverted device, the first electrode layer can also be a cathode, and the second electrode layer can also be an anode.

The encapsulation layer 50 is positioned in the light-emitting area 100a and the peripheral area 100b. The encapsulation layer 50 covers the light-emitting layer 40 and is used to protect the light-emitting layer 40 to prevent water and oxygen from entering and causing the light-emitting layer 40 to fail. Optionally, the encapsulation layer 50 may adopt a thin film encapsulation (TFE) structure. The encapsulation layer 50 includes at least one inorganic layer and at least one organic layer. The inorganic layers and the organic layers are alternately stacked. In this embodiment, the encapsulation layer 50 includes a first inorganic layer 51, an organic encapsulation layer 52, and a second inorganic layer 53 stacked in sequence to form the encapsulation layer 50. In addition, the display panel 100 further includes a retaining wall DAM. The retaining wall DAM is provided on the driving circuit layer 30 and positioned between the light-emitting layer 40 and the first undercut structure UD1. In other words, the retaining wall DAM is positioned on the peripheral area 100b for blocking the organic encapsulation layer 52 in the encapsulation layer 50.

In the present application, the common layer 44 includes a first portion 441 and a second portion 442, and the first portion 441 is positioned in the light-emitting area 100a and the peripheral area 100b. The second portion 442 is at least partially positioned in groove 11a, and the first portion 441 and the second portion 442 are disconnected by the first undercut structure UD1. Optionally, the second portion 442 covers the bottom wall of groove 11a and extends outside the groove 11a. At least one inorganic layer, that is, the first inorganic layer 51 and the second inorganic layer 53 cover the end of the first portion 441 away from the light-emitting area 100a, and the end of the at least one inorganic layer far away from the light-emitting area 100a does not exceed the end of the common layer 44 far away from the light-emitting area 100a. Specifically, the end of the at least one inorganic layer away from the light-emitting area 100a is flush with the end of the common layer 44 away from the light-emitting area 100a. Alternatively, the end of the common layer 44 away from the light-emitting area 100a (i.e., the end of the second portion) is positioned on a side close to the light-emitting area 100a. In other words, at least one inorganic layer is far from the light-emitting area 100a and does not cover the end of the common layer 44 far away from the light-emitting area 100a. Further, at least one inorganic layer covers and fills the groove 11a, and is in direct contact with the inorganic insulating layer 20 and the dielectric layer 31 on the sidewall 101W of the groove 11a.

In some embodiments, the common layer 44 is disconnected by the first undercut structure UD1, and the propagation path of water and oxygen between the first portion 441 and the second portion 442 of the common layer 44 is cut off, which can act as a water and oxygen barrier and prevent cracks extend. The inorganic layer in the encapsulation layer only needs to cover the end of the first portion 441 positioned in the light-emitting area 100a and does not need to cover the end of the common layer 44 away from the light-emitting area 100a. In the present invention, the end of the inorganic layer away from the light-emitting area 100a does not exceed the end of the common layer 44 away from the light-emitting area 100a. Compared with a situation in the prior art where the inorganic layer needs to cover the end of the common layer 44 away from the light-emitting area 100a, the encapsulation width of the encapsulation layer 50 proposed by the present invention is significantly reduced, thereby achieving the effect of a narrow frame.

In some embodiments, when the undercut structure is formed on the first flexible base 11, if a signal line is disposed above the first flexible base 11, the formation of the undercut structure will be affected. By switching the signal line in the bending area 100c to positioned between the two layers of flexible bases, there is no signal line above the first flexible base 11, which facilitates the formation of an undercut structure on the first flexible base 11 and achieves the narrow-frame packaging technology.

In some embodiments, the first undercut structure UD1 forms a complete closed loop around the light-emitting area, which can further enhance the encapsulation effect.

In some embodiments, the opening 101 is not filled with a flexible organic material, but is filled with a gas or a vacuum layer. Compared with the prior art, the structure in which the flexible organic material is filled in the opening 101 of the bending area 100c can prevent the occurrence of outgassing. "Outgassing" is caused by the characteristics of organic materials, that is, in the subsequent high-temperature process, gas will be released from the organic layer, and the gas will destroy the structure of the upper layer.

In some embodiments, since an opening for bending needs to be formed on the bending area 100c, a groove is further defined on the basis that the opening has been formed, so that the opening can be used to form the first undercut structure UD1, which reduces the etching steps and simplifies the manufacturing process. By forming the groove 11a on the sidewall 101W of the opening 101 close to the light emitting area 100a, and forming an undercut structure on the sidewall 101W of the bending portion 1001 close to the light emitting area 100a, the effect of narrowing the frame can be achieved.

Figure 6:
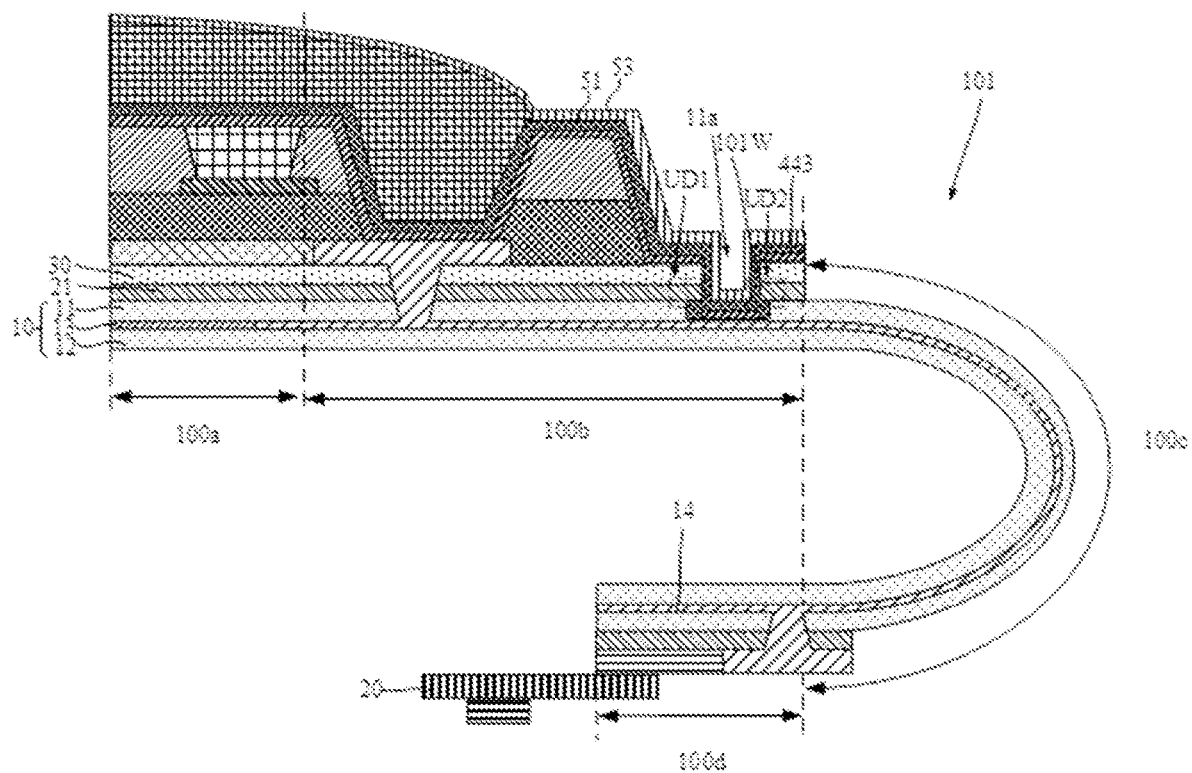
FIG. 6 is a cross-sectional view of another structure of the display device of FIG. 1 taken along the line A-A.

Please refer to FIG. 6, in another structure of the display panel 100, the inorganic insulating layer 20 in the opening 101 is not all etched, and a part of the inorganic insulating layer 20 in the opening 101 close to the light-emitting area 100a is retained. Meanwhile, a groove 11a is formed in this part of the inorganic insulating layer 20. In addition to the first undercut structure UD1, a second undercut structure UD2 is formed on the sidewall 101W of the groove 11a, and the second undercut structure UD2 is positioned on the sidewall 101W of the groove 11a away from the light emitting area 100a. The common layer 44 further includes a third portion 443 positioned on a side of the second portion 442 away from the first portion 441, and the second portion 442 and the third portion 443 are disconnected by the second undercut structure UD2. The third portion 443 of the common layer 44 is positioned on the inorganic insulating layer 20 and the dielectric layer 31. At least one inorganic layer, that is, the first inorganic layer 51 and the second inorganic layer 53 cover the end of the first portion 441 away from the light-emitting area 100a, and the end of the at least one inorganic layer away from the light emitting area 100a does not exceed the end of the third portion 443 away from the light emitting area 100a. The end of the at least one inorganic layer away from the light-emitting area 100a may be flush with the end of the third portion 443 away from the light-emitting area 100a as shown in the figure. It can also be positioned on the side of the end of the third portion 443 away from the light-emitting area 100a close to the light-emitting area 100a, or cover only the end of the first portion 441, only the end of the second portion 442 or a part of the second portion 442. Optionally, at least one inorganic layer covers the groove 11a and is in direct contact with the inorganic insulating layer 20 and the dielectric layer 31 in the sidewalls 101W of the groove 11a away from the light-emitting area 100a and close to the light-emitting area 100a to form a closed inorganic packaging structure, so that the second portion 442 is encapsulated.

In this embodiment, the common layer is cut into three parts by the first undercut structure UD1 and the second undercut structure UD2, so the crack prevention effect is better.

It can be understood that in other embodiments of the present application, only the second undercut structure UD2 may be provided, and the effect of a narrow frame can also be obtained.

This specification provides a detailed introduction to the embodiments of the present application. Specific embodiments are used herein to illustrate the principles and implementations of the present application. The descriptions of the aforesaid embodiments are only used to help understand the present application. Meanwhile, for one skilled in the art, according to the idea of the present application, there will be changes in the specific embodiments and the scope of application. In conclusion, the content of this specification should not be construed as a limitation on the present application.

What is claimed is:

1. A display panel defined with a light-emitting area and a peripheral area positioned on at least one side of the light-emitting area, wherein the display panel comprises:
   a substrate comprising a first flexible base;
   an inorganic insulating layer disposed on a side of the substrate;
   a driving circuit layer disposed on a side of the inorganic insulating layer away from the substrate;
   a light-emitting layer disposed on a side of the driving circuit layer away from the inorganic insulating layer, wherein the light-emitting layer comprises a common layer; and
   an encapsulation layer disposed on a side of the light-emitting layer away from the driving circuit layer, wherein the encapsulation layer comprises at least one inorganic layer;
   wherein the peripheral area is defined with a groove penetrating the inorganic insulating layer and the first flexible base, wherein a sidewall of the groove is defined with a first undercut structure, wherein the common layer comprises a first portion and a second portion, the first portion is positioned at the light-emitting area and the peripheral area, the second portion is at least partially positioned at the groove, and the first portion and the second portion are disconnected by the first undercut structure, and wherein the at least one inorganic layer covers an end of the first portion away from the light-emitting area, and an end of the at least one inorganic layer away from the light-emitting area does not exceed an end of the common layer away from the light-emitting area;

wherein the display panel is further defined with an opening exposing a portion of the substrate, wherein the portion of the substrate exposed by the opening is bent to a back of the display panel to form a bending portion, and wherein the groove communicates with the opening and is defined on a sidewall of the opening close to the light-emitting area.

2. The display panel of claim 1, wherein the substrate further comprises:
a second flexible base disposed on a side of the first flexible base away from the driving circuit layer; and
a barrier layer and a line switching layer arranged in a same layer between the first flexible base and the second flexible base, wherein the line switching layer is arranged corresponding to the opening;
wherein the driving circuit layer comprises a first signal line and a first fan-out line, the first signal line is positioned at the light-emitting area, the first fan-out line is positioned at the back of the display panel, and the first signal line and the first fan-out line are respectively connected to the line switching layer through via-holes.

3. The display panel of claim 2, wherein the driving circuit layer further comprises a second signal line and a second fan-out line arranged in different layers, the second signal line is positioned at the light-emitting area, the second fan-out line is positioned at the back of the display panel, the line switching layer is positioned between the second signal line and the second fan-out line, and the second signal line and the second fan-out line are respectively connected to the line switching layer through via holes.

4. The display panel of claim 3, wherein the first signal line and the first fan-out line are arranged in a same layer, and the second signal line and the second fan-out line are arranged in a same layer, wherein the line switching layer comprises a first switching line and a second switching line insulated from each other and spaced apart, the first signal line is connected to the first fan-out line through the first switching line, and the second signal line is connected to the second fan-out line through the second switching line.

5. The display panel of claim 4, wherein the driving circuit layer comprises a gate electrode and a source electrode arranged in different layers, the first signal line is arranged in a same layer as the gate electrode, and the second signal line is arranged in a same layer as the source electrode.

6. The display panel of claim 1, wherein a surface of the first flexible base of the bending portion away from the line switching layer comprises a gas medium layer or a vacuum layer.

7. The display panel of claim 1, wherein the common layer comprises at least one of an electron injection layer, an electron transport layer, or an electrode layer.

8. The display panel of claim 1, wherein the peripheral area encircles the light-emitting area, the first undercut structure encircles the light-emitting area to form a closed loop, and the first undercut structure is positioned on the sidewall of the groove close to the light-emitting area.

9. The display panel of claim 8, wherein the sidewall of the groove away from the light-emitting area is further defined with a second undercut structure, and wherein the common layer further comprises a third portion positioned on a side of the second portion away from the first portion, and the second portion and the third portion are disconnected by the second undercut structure.

10. The display panel of claim 9, further comprising a dielectric layer disposed between the inorganic insulating layer and the light-emitting layer and positioned at the peripheral area, wherein the groove further penetrates the dielectric layer, and the at least one inorganic layer covers the groove and is in direct contact with the inorganic insulating layer and the dielectric layer on the sidewall of the groove to form a closed inorganic packaging structure.

11. A display device, comprising a display panel and a driving component connected to the display panel;
the display panel defined with a light-emitting area and a peripheral area positioned on at least one side of the light-emitting area, wherein the display panel comprises:
a substrate comprising a first flexible base;
an inorganic insulating layer disposed on a side of the substrate;
a driving circuit layer disposed on a side of the inorganic insulating layer away from the substrate;
a light-emitting layer disposed on a side of the driving circuit layer away from the inorganic insulating layer, wherein the light-emitting layer comprises a common layer; and
an encapsulation layer disposed on a side of the light-emitting layer away from the driving circuit layer, wherein the encapsulation layer comprises at least one inorganic layer;
wherein the peripheral area is defined with a groove penetrating the inorganic insulating layer and the first flexible base, wherein a sidewall of the groove is defined with a first undercut structure, wherein the common layer comprises a first portion and a second portion, the first portion is positioned at the light-emitting area and the peripheral area, the second portion is at least partially positioned at the groove, and the first portion and the second portion are disconnected by the first undercut structure, and wherein the at least one inorganic layer covers an end of the first portion away from the light-emitting area, and an end of the at least one inorganic layer away from the light-emitting area does not exceed an end of the common layer away from the light-emitting area;
wherein the display panel is further defined with an opening exposing a portion of the substrate, wherein the portion of the substrate exposed by the opening is bent to a back of the display panel to form a bending portion, and wherein the groove communicates with the opening and is defined on a sidewall of the opening close to the light-emitting area.

12. The display device of claim 11, wherein the substrate further comprises:
a second flexible base disposed on a side of the first flexible base away from the driving circuit layer; and
a barrier layer and a line switching layer arranged in a same layer between the first flexible base and the second flexible base, wherein the line switching layer is arranged corresponding to the opening;
wherein the driving circuit layer comprises a first signal line and a first fan-out line, the first signal line is positioned at the light-emitting area, the first fan-out line is positioned at the back of the display panel, and the first signal line and the first fan-out line are respectively connected to the line switching layer through via-holes.

13. The display device of claim 12, wherein the driving circuit layer further comprises a second signal line and a second fan-out line arranged in different layers, the second signal line is positioned at the light-emitting area, the second fan-out line is positioned at the back of the display panel, the line switching layer is positioned between the second signal line and the second fan-out line, and the second signal line and the second fan-out line are respectively connected to the line switching layer through via holes.

14. The display device of claim 13, wherein the first signal line and the first fan-out line are arranged in a same layer, and the second signal line and the second fan-out line are arranged in a same layer, wherein the line switching layer comprises a first switching line and a second switching line insulated from each other and spaced apart, the first signal line is connected to the first fan-out line through the first switching line, and the second signal line is connected to the second fan-out line through the second switching line.

15. The display device of claim 14, wherein the driving circuit layer comprises a gate electrode and a source electrode arranged in different layers, the first signal line is arranged in a same layer as the gate electrode, and the second signal line is arranged in a same layer as the source electrode.

16. The display device of claim 11, wherein a surface of the first flexible base of the bending portion away from the line switching layer comprises a gas medium layer or a vacuum layer.

17. The display device of claim 11, wherein the common layer comprises at least one of an electron injection layer, an electron transport layer, or an electrode layer.

18. The display device of claim 11, wherein the peripheral area encircles the light-emitting area, the first undercut structure encircles the light-emitting area to form a closed loop, and the first undercut structure is positioned on the sidewall of the groove close to the light-emitting area.

* * * * *